United States Patent [19]

Azad

[11] Patent Number: 4,971,652
[45] Date of Patent: Nov. 20, 1990

[54] METHOD AND APPARATUS FOR CRYSTAL GROWTH CONTROL

[75] Inventor: Farzin H. Azad, Clifton Park, N.Y.

[73] Assignee: General Electric Company, Schenectady, N.Y.

[21] Appl. No.: 451,685

[22] Filed: Dec. 18, 1989

[51] Int. Cl.⁵ .................. C30B 15/22; C30B 35/00
[52] U.S. Cl. .................. 156/619.1; 422/249
[58] Field of Search .............. 422/249, 248; 156/601, 156/619.1

[56] References Cited

U.S. PATENT DOCUMENTS

| | | | |
|---|---|---|---|
| 3,795,488 | 3/1974 | Oliver | 23/301 SP |
| 3,798,007 | 3/1974 | Bochman et al. | 23/301 SP |
| 3,833,342 | 9/1974 | Holliday | 23/273 SP |
| 3,980,438 | 9/1976 | Castonguay et al. | 23/273 SP |
| 4,000,030 | 12/1976 | Ciszek | 156/608 |
| 4,184,907 | 1/1980 | Yates | 156/601 |
| 4,233,270 | 11/1980 | Schmidt | 422/249 |
| 4,239,583 | 12/1980 | Hatch et al. | 156/601 |
| 4,263,065 | 4/1981 | Wang et al. | 156/600 |
| 4,350,557 | 8/1982 | Scholl et al. | 156/601 |
| 4,565,598 | 1/1986 | Seymour | 156/601 |
| 4,591,994 | 5/1986 | Washizuka et al. | 364/500 |
| 4,603,034 | 7/1986 | Vickery | 422/246 |
| 4,604,262 | 8/1986 | Nishizawa | 422/310 |
| 4,650,540 | 3/1987 | Stoll | 156/618 |
| 4,654,110 | 3/1987 | Morrison | 156/619.1 |
| 4,659,421 | 4/1987 | Jewett | 156/617 SP |
| 4,687,646 | 8/1987 | Mateika et al. | 422/248 |
| 4,734,267 | 3/1988 | Kojima | 422/249 |
| 4,822,449 | 4/1989 | Motakef | 156/601 |
| 4,857,278 | 8/1989 | Gevelber et al. | 422/249 |

*Primary Examiner*—Gary P. Straub
*Assistant Examiner*—Stephen G. Kalinchak
*Attorney, Agent, or Firm*—John S. Beulick; James C. Davis, Jr.; Paul R. Webb, II

[57] ABSTRACT

A method and apparatus for crystal growth control in a Czochralski crystal pulling process are provided wherein a plurality of thermocouples and individually controllable heating elements are embedded in an upper control section of a raised platform in a crucible containing a melt from which the crystal is pulled. The upper control section is disposed in the melt at a height below the bulk level of the melt in the crucible and underneath the crystal being pulled so as to retain the thermocouples in a position to monitor the temperature distribution of the melt below a solidification front of the crystal, and to retain the individually controllable heating elements in a position whereby the heating elements may be selectively controlled to attain a predetermined temperature distribution in the melt in a region underneath the solidification front.

13 Claims, 2 Drawing Sheets

METHOD AND APPARATUS FOR CRYSTAL GROWTH CONTROL

BACKGROUND OF THE INVENTION

1. Field of the Invention

The present invention relates to a method and apparatus for control of crystal growth, and more specifically to controlling a temperature distribution near a solidification interface during crystal growth by the Czochralski method.

2. Description of Related Art

The well-known Czochralski method of growing crystals involves contacting a seed crystal with a melt of the crystal material contained in a heated crucible. The growth of large, substantially defect-free crystals by this and other methods remains to this day a difficult task, due to complications brought about by temperature gradients and convective eddies within the melt.

Previous attempts at controlling the crystal growth process to improve the quality of the crystals produced have primarily involved controlling process parameters such as crucible or crystal rotation speeds, crystal pulling rate, and total heat supplied to the crucible. Application of magnetic fields has also been used in attempting to suppress convective eddies within the melt. A further approach directed to suppressing or eliminating convection cells below a solidification interface has been to provide a baffle or other solid object in the crucible in the vicinity of the solidification front. All of the above approaches share the disadvantage that the controls tend to produce only bulk effects within the melt, and generally do not have any substantial effect on controlling the solidification interface as the crystal is pulled, which is possibly the most critical aspect of crystal growth, in terms of minimizing or substantially eliminating defects formed when growing large crystals.

Optical or electro-optical monitoring of the melt at the melt-crystal interface and controlled cooling of the pulled crystal are other known approaches directed to improving the quality of the crystal end product. External surface heating of the melt to maintain a predetermined temperature just above the melting temperature of the material has also been proposed. None of these approaches are believed to provide adequate control over the thermal conditions in the melt in the immediate vicinity of the solidification front of the pulled crystal.

It is therefore a principal object of the present invention to provide an apparatus whereby direct control of the thermal conditions in the vicinity of the solidification front or interface may be achieved.

It is an additional object of the present invention to provide a method for controlling the thermal conditions and radial temperature distribution in a melt in the vicinity of the solidification front of the crystal being pulled.

It is a further object of the present invention to provide an apparatus having a plurality of temperature measuring devices and an associated plurality of independently controllable heaters disposed at a location in the vicinity of the solidification front of the crystal being pulled.

It is a further object of the present invention to provide an apparatus which will yield crystals grown by the Czochralski method having improved size, yield and quality.

SUMMARY OF THE INVENTION

The above and other objects of the present invention are accomplished by providing a crucible which, in addition to having bulk heating means as known previously in the art, also has a raised platform in the central of the crucible having an upper control section which holds a plurality of thermocouples and an associated plurality of heater means. Each heater means is individually controllable and the control of each of the heaters is effected by temperature readings obtained at the associated thermocouples which are disposed in close proximity to the heaters.

The platform is preferably designed to extend upwardly from the bottom of the crucible to a height near the surface of the melt, and to a position under the seed and crystal being pulled. The thermocouples and associated heaters may thus provide heat, as required, to precise locations near and under the solidification front of the crystal. This precise control of the thermal conditions in the vicinity of the solidification front permits control of the shape of the solidification front, and substantially reduces or eliminates problems attributable to the aforementioned temperature gradients and convective eddies in the melt.

BRIEF DESCRIPTION OF THE DRAWINGS

These and other features of the present invention and the attendant advantages will be readily apparent to those having ordinary skill in the art and the invention will be more easily understood from the following detailed description of the preferred embodiment of the present invention taken in conjunction with the accompanying drawings wherein like reference characters represent like parts throughout the several views, and wherein.

DETAILED DESCRIPTION OF THE PREFERRED EMBODIMENT

Figure 1:
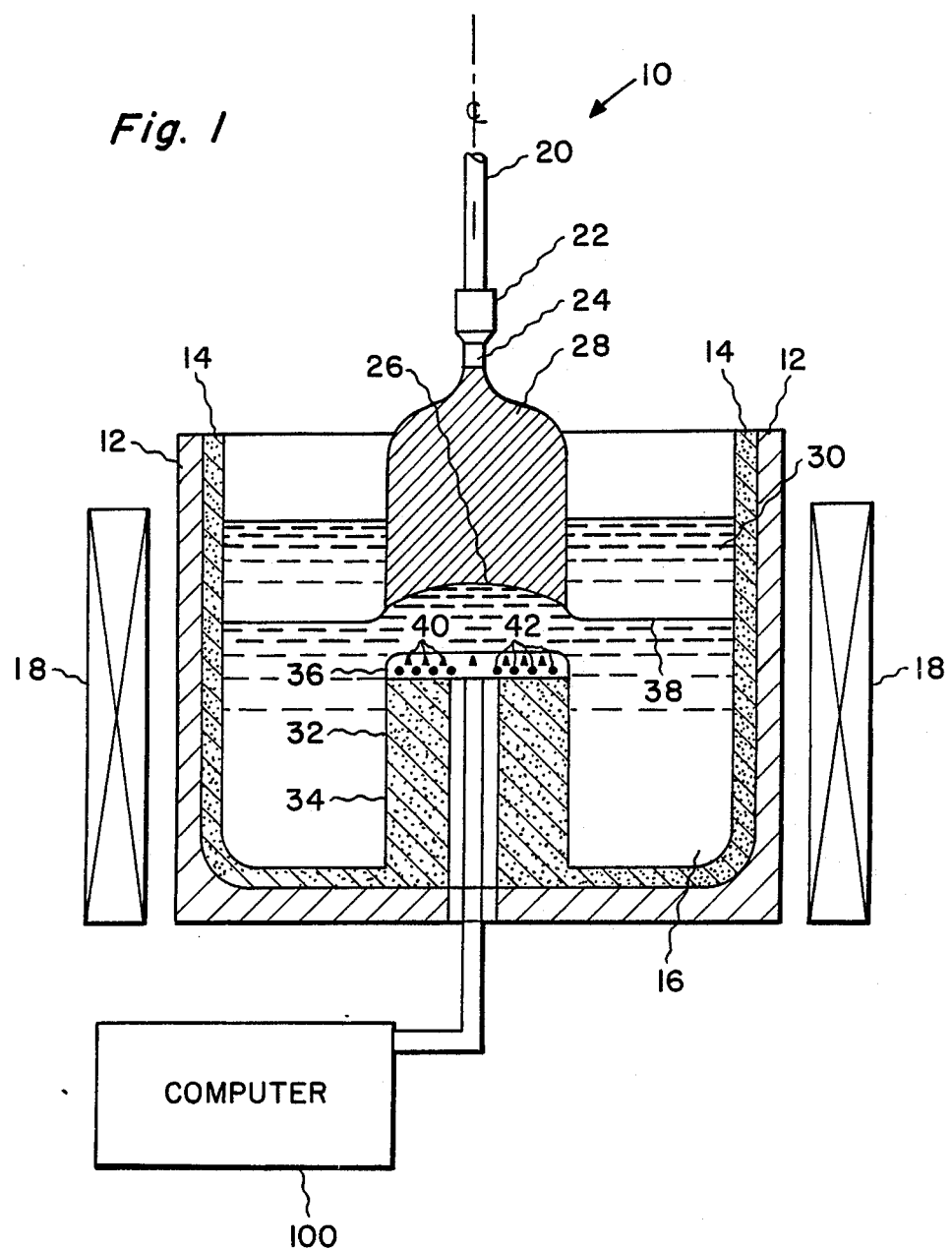
FIG. 1 depicts a cross-sectional elevation view of a crucible design in accordance with a preferred embodiment of the present invention.

Referring initially to FIG. 1, an apparatus, designated as numeral 10, for growing single crystals according to a preferred embodiment of the present invention is shown. The basic method of crystal growth in this preferred embodiment is a Czochralski-type crystal pulling method.

The apparatus 10 has a crucible 12 with a closefitting liner 14 adapted to contain a melt 16 of the material to be pulled into a crystal. Except where indicated later in the specification, crucible 12 is of conventional design, and may be retained in a frame (not shown) in a stationary manner. Alternatively, crucible 12 may be mounted in a suitable frame in another known manner such that the crucible is capable of being rotated about a central vertical axis or of being raised or lowered in the frame. The manner in which the crucible is mounted may be selected based on particular process variables and does not specifically form a part of the present invention.

The liner 14 employed inside crucible 12 is provided to isolate the melt 16 from the walls of the crucible. At the melt temperatures involved in this crystal growing process, the material from the walls of the crucible is prone to being taken into solution in the melt 16, and therefore tends to contaminate the melt and the crystal grown therefrom. The linear material is therefore preferably selected, as is known in the art, to be resistant to reaction with the melt at the temperatures experienced during the crystal growing process. Two examples of preferred liner materials are pyrolytic boron nitride, which is preferably used when a Ga As melt is being pulled into a Ga-As crystal, and iridium, which is preferably used in pulling Nd-YAG crystals.

Surrounding the crucible 12 around a circumference thereof, and preferably extending along a predetermined vertical height, is a heater (or heaters), shown schematically at 18. Examples of such heaters are well known in the art, and may preferably comprise graphite heaters. This external heater 18 is employed to keep the bulk temperature of the melt at a predetermined level.

The apparatus 10 further comprises a pulling rod 20, which is preferably adapted to be rotated about its longitudinal axis, and is constructed to be capable of vertical movement at a controlled rate with respect to melt 16. Pulling rod 20 has a chuck 22 disposed at a lower end to which a crystal seed 24 is attached in a manner well known with respect to Czochralski crystal growth methods. As in previously disclosed Czochralski processes, the seed 24 is brought into contact with the melt 16 at an upper central surface of the melt, and the pulling rod 20, chuck 22, and seed 24 are pulled vertically upwardly, and preferably concurrently rotated in drawing the molten material from the melt. The material solidifies along a solidification front or interface 26, forming a single crystal 28 grown as an extension of the seed 24. Although not shown in the Figure, the level of the melt 16 is preferably retained at a substantially constant height by supplying molten material into the crucible at the same rate at which molten material is drawn out and solidified. Methods for supplying the replacement molten material are well known, and form no part of the present invention.

Depending upon the particular type of crystal being grown in the process, an encapsulating medium 30 may optionally be provided over the surface of the melt 16, as is known in the art. The encapsulating medium is chosen such that it is lighter than the melt so that it will "float" on the surface, so that it will not contaminate the melt, and so that it will isolate the melt from the environment. A typical material employed as an encapsulating medium when growing GaAs crystals would be $B_2O_3$.

The apparatus 10 as described thus far is representative of a conventional Czochralski device with which the method for controlling crystal growth according the the present invention may be practiced, once the apparatus is augmented as will know be discussed. In accordance with a preferred embodiment of the invention, the crucible 12 of the apparatus is provided with a raised active platform 32 which comprises a base section 34, an upper control section 36, which is disposed in a substantially parallel, but not coplanar, orientation with respect to the upper surface or bulk level 38 of the melt. As depicted, the base section and upper control section form essentially a monolithic structure extending upwardly from the center of the base of the crucible liner 14. The base section may be regarded as a means for retaining the upper control section in a predetermined position. The material from which the platform is constructed may be either identical to the selected liner material or may optionally be another material capable of withstanding the melt temperatures encountered and which will not react with and contaminate the molten material.

The upper control platform 36 is preferably disposed in a position centered underneath the solidification front of the crystal being pulled. It is to be noted that the base section 34 may optionally comprise a plurality of posts extending upwardly from the bottom of the crucible liner, or possibly extending radially inwardly from the sides of the crucible liner.

Figure 2:
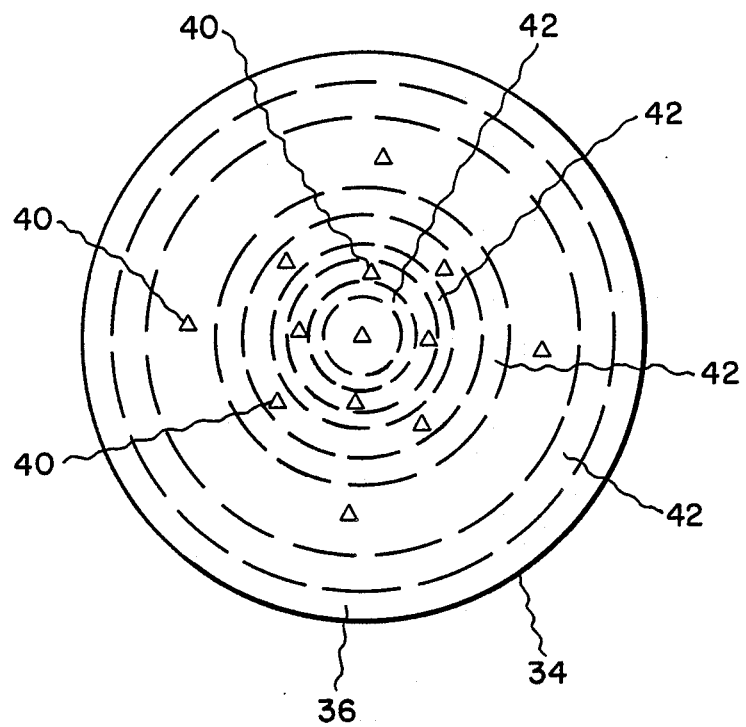
FIG. 2 illustrates a top view of the control section illustrated in FIG. 1.

Embedded in the upper control section 36 of the active platform 32 are a plurality of thermocouples 40 and a plurality of individually controlled heating elements 42. The heating elements 42 are preferably arranged in a concentric fashion, as best depicted in FIG. 2, in order to control the temperature distribution and particularly the radial temperature distribution at the crystal solidification front 26. Other arrangement may of course be employed, provided the controllability of the heating elements 42 permits attaining a desired radial temperature distribution or profile at and in the region near the solidification front. The upper control surface preferably has a radial dimension approximately the same as or larger than the crystal being grown in order to have the capability of monitoring and controlling the temperature across the entire radial extent of the solidification front. The heating elements 42 are preferably graphite rods formed into the annular shapes depicted in FIG. 2.

The thermocouples 40 are embedded in the upper control section near the upper surface thereof to provide an indication of the temperature on the surface. The thermocouples are preferably arranged, as depicted in FIGS. 1 and 2 in a staggered, spaced manner with respect to heating elements 42. This positioning provides temperature readings on either side of each heating element and gives an indication of the radial temperature distribution from the center of the platform to the edges of the platform. Feedback is obtained from the thermocouples in order to make it possible to impose any desired temperature distribution on the upper surface of the upper control section. In this preferred embodiment, a computer 100 is used to receive the signals or feedback from thermocouples 40, and the computer uses this information to control the individual heating elements 42 as necessary to achieve and/or maintain a predetermined desired temperature distribution.

The shape of the solidification front 26 and the convective transport of the melt in the gap or region between the solidification and the upper control section are directly affected by the temperature distribution in the immediate vicinity of the solidification front, which is controlled in the present apparatus by the temperature distribution at the upper surface of the upper control section 36. The melt/crystal interface conditions may therefore be readily controlled throughout the crystal growth cycle by imposing a predetermined desired temperature history on the upper surface of the control section 36.

The method for crystal growth control employing the apparatus of the present invention involves the steps of pulling a crystal from a melt wherein solidification front is formed at an interface between the crystal and melt, monitoring the temperature distribution in the melt at a region underneath the solidification front, and selectively controlling a plurality of individually controlled heating elements disposed in the melt in the region directly below the solidification front in response to the monitoring of the temperature distribution.

Optimization of the size, yield and quality of the crystals grown using the apparatus and method of the present invention can be achieved by performing analytic simulations of the crystal growth process for materials of interest, and using such simulations to develop the predetermined desired temperature distributions employed by the computer in controlling heating elements 42, as well as peripheral heaters 18, as necessary. For example, control of the temperature distribution using the control section of the present invention can be used to shape the solidification interface to be slightly concave downwardly as shown in FIG. 1, or to be slightly concave upwardly, if a particular analytic simulation indicates the concave upward shape to be desirable.

Furthermore, the amount of convective transport in the melt can be minimized by positioning the upper control section at an optimal distance below the solidification front. If the upper control section 36 is situated too close to the melt/crystal interface, the upper control section of the platform 32 will have a tendency to break up the fluid flow in the melt and to permit the formation of small convection cells below the solidification interface, even when a proper temperature distribution is maintained. Conversely, the upper control section 36 must be close enough to the solidification interface 26 in order to allow accurate reading and controlling of the temperature distribution in the melt in the vicinity of the solidification interface.

A preferred height or position of the upper control surface is therefore slightly below the bulk level 36 of the melt in the crucible, at which position of the thermocouples 40 and heating elements 42 will be close enough to the solidification interface to adequately monitor and control the temperature distribution in the vicinity of the interface. Further, when the upper control surface 36 is so located, the gap between the control surface and the melt/crystal interface 26, which is generally at a somewhat higher level than the bulk melt level 38, is sufficiently large so as to not cause the formation of small convection cells near the interface 26.

It is to be understood and recognized that the foregoing detailed description of the invention is given merely by way of illustration, and that numerous modifications and variations will be apparent to those skilled in the art without departing from the spirit or scope of the present invention. Therefore, the scope of the invention is to be determined by reference to the appended claims.

What is claimed is:

1. Apparatus comprising:
   means for containing a melt of material to be grown into a crystal;
   means for monitoring the temperature distribution of the solidification interface, the solidification interface being formed between the crystal and the melt during a crystal boule pulling process; and
   heater means responsive to said monitoring means for controlling the temperature distribution at the solidification interface; and wherein said monitoring means and said heater means are disposed in said melt in a region underneath said solidification interface and above a bass of said means for containing a melt.

2. Apparatus as recited in claim 1 further comprising a control section and means for retaining said control section disposed in a position in said melt, and wherein said monitoring means and said temperature distribution control means are disposed on said control section.

3. Apparatus as recited in claim 2 wherein said temperature distribution control means comprises a plurality of independently controlled heater elements.

4. Apparatus as recited in claim 3 wherein said monitoring means comprises a plurality of thermocouples disposed at an upper surface of said control section.

5. Apparatus as recited in claim 4 wherein said heater elements are substantially annular in shape and are embedded in said control section in a spaced, concentric manner.

6. Apparatus as recited in claim 5 wherein said thermocouples are disposed, in a radial direction, in said spaces between said concentrically disposed heater elements.

7. Apparatus as recited in claim 6 wherein said retaining means for said control section comprises a platform base, said platform base and said control section comprising a monolithic platform extending upwardly from a bottom of said crucible.

8. A method comprising the steps of:
   pulling a crystal boule from a melt of material, a solidification front being formed at an interface between the crystal and the melt;
   monitoring the temperature distribution of the solidification front; and
   selectively controlling heater means disposed in said melt underneath said solidification front for controlling the temperature distribution at the solidification front in response to the step of monitoring the temperature distribution.

9. A method as recited in claim 8 wherein selective control of said heater means further comprises the step of selectively controlling a plurality of annular, individual controllable heating elements disposed in a concentric arrangement to attain a desired radial temperature distribution.

10. A method as recited in claim 9 wherein the step of monitoring the temperature distribution is effective by a plurality of thermocouples disposed in spaces between the concentrically arranged annular heating elements in a radially extending pattern on a control section of a raised platform disposed in a crucible containing a melt, and monitoring the temperature distribution further comprises the step of containing radial temperature distribution information in a region adjacent and underneath the solidification front.

11. A method for controlling growth in a single crystal boule being pulled from a melt contained in a crucible, said method comprising the steps of:
   monitoring a temperature distribution in a region of the melt underneath a solidication front formed at an interface between the crystal and the melt; and
   selectively controlling a plurality of individually controllable heating elements in response to the temperature distribution, the heating elements being disposed so as to affect the temperature distribution of the solidfication front when activated.

12. A method as recited in claim 11 wherein monitoring the temperature distribution is affected by a plurality of thermocouples disposed in a radially extending pattern on a control section of a raised platform disposed in the crucible, and monitoring the temperature distribution further comprises the step of obtaining radial temperature distribution information in the melt region underneath the solidification front.

13. A method as recited in claim 12 wherein the individually controllable heating elements are substantially annular in shape and are disposed in a spaced concentric arrangement, and the heating elements are selectively controlled to attain a desired radial temperature distribution in the melt region underneath the solidification front.

* * * * *